United States Patent [19]
Morimoto et al.

[11] Patent Number: 5,273,935
[45] Date of Patent: Dec. 28, 1993

[54] METHOD OF CONTROLLING ETCHING WITH A FOCUSED CHARGED BEAM BY DETECTING ELECTRICAL CURRENT OR SECONDARY ELECTRONS

[75] Inventors: Hiroaki Morimoto; Hiroshi Onoda, both of Itami, Japan

[73] Assignee: Mitsubishi Denki Kabushiki Kaisha, Tokyo, Japan

[21] Appl. No.: 501,275

[22] Filed: Mar. 29, 1990

[30] Foreign Application Priority Data

Mar. 30, 1989 [JP] Japan ................... 1-83187
Feb. 20, 1990 [JP] Japan ................... 2-37221

[51] Int. Cl.$^5$ .................. H01L 21/263; H01L 21/42
[52] U.S. Cl. ........................ 437/173; 437/225; 250/492.2
[58] Field of Search .......... 250/492.2; 437/173, 437/225

[56] References Cited

U.S. PATENT DOCUMENTS

| | | | |
|---|---|---|---|
| 4,487,635 | 12/1984 | Kugimiya et al. | 437/173 |
| 4,609,809 | 9/1986 | Yamaguchi et al. | 219/121 |
| 4,634,871 | 1/1987 | Knauer | 250/492.2 |
| 4,639,301 | 1/1987 | Doherty et al. | 204/192.34 |
| 4,851,097 | 7/1989 | Hattori et al. | 204/298.33 |
| 4,874,947 | 10/1989 | Ward et al. | 250/492.2 |
| 4,933,565 | 6/1990 | Yamaguchi et al. | 250/309 |

FOREIGN PATENT DOCUMENTS

| | | | |
|---|---|---|---|
| 59-14548 | 4/1984 | Japan. | |
| 61-224319 | 10/1986 | Japan. | |
| 61-230318 | 10/1986 | Japan | 437/173 |

*Primary Examiner*—Brian E. Hearn
*Assistant Examiner*—Laura M. Holtzman
*Attorney, Agent, or Firm*—Leydig, Voit & Mayer

[57] ABSTRACT

Accurate etching control using focused ion beams can be achieved if the etching is performed in accordance with a detection signal obtained by detecting an electric current passing from a semiconductor device to ground or secondary electrons generated when the charged beams are spirally applied to a predetermined area during the charged-beam scanning operation. Therefore, the end point of the process can be accurately detected and uniform processing results can be obtained. As a result, precise etching control can be performed and a reliable semiconductor device can be manufactured.

10 Claims, 12 Drawing Sheets

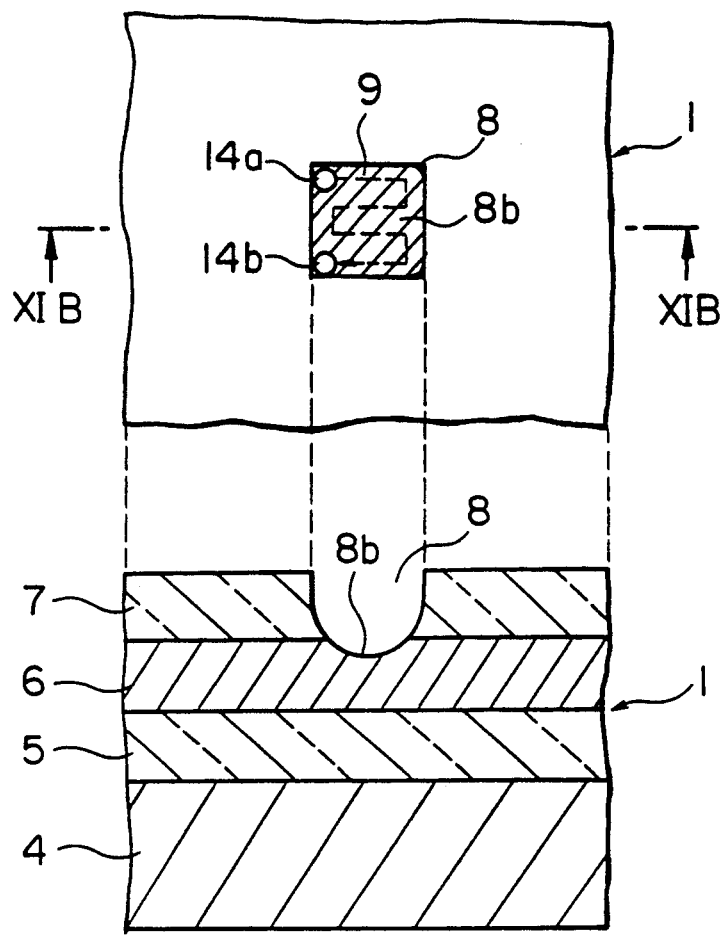
FIG. 11A PRIOR ART
FIG. 11B PRIOR ART
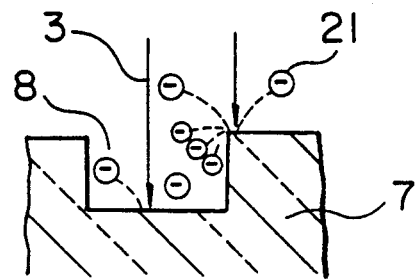
FIG. 14

FIG. 12A
PRIOR ART
FIG. 12B
PRIOR ART
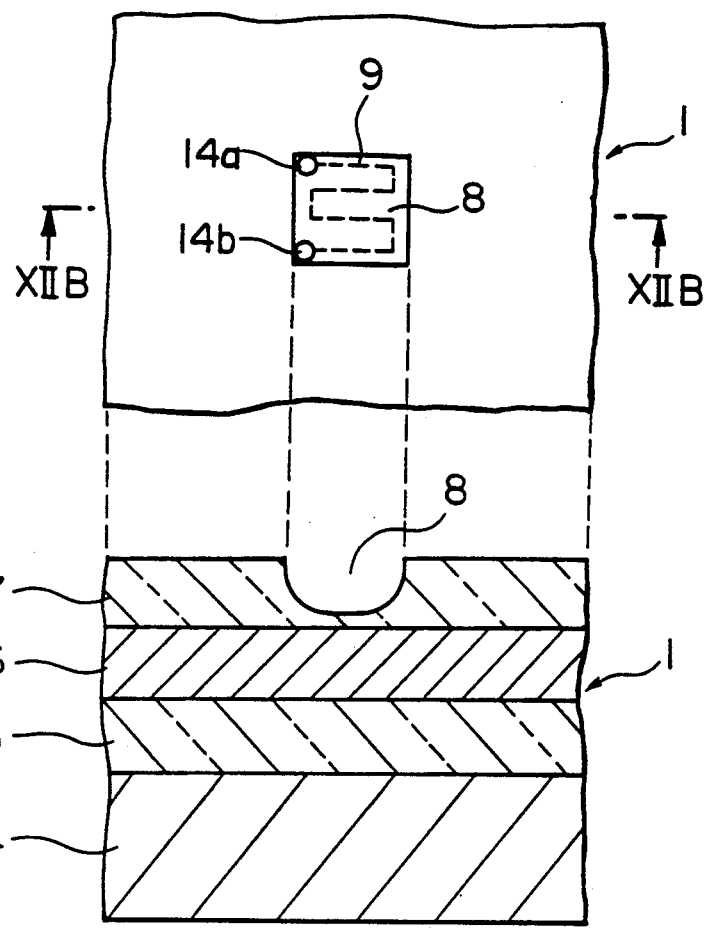
FIG. 13
PRIOR ART
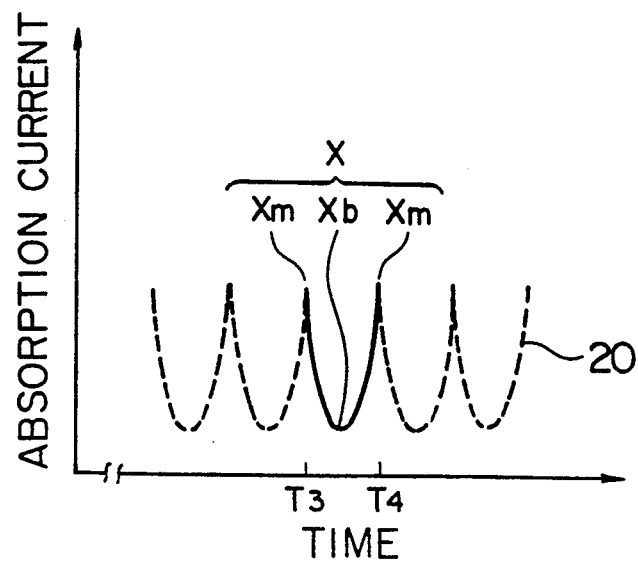

FIG. 17 PRIOR ART
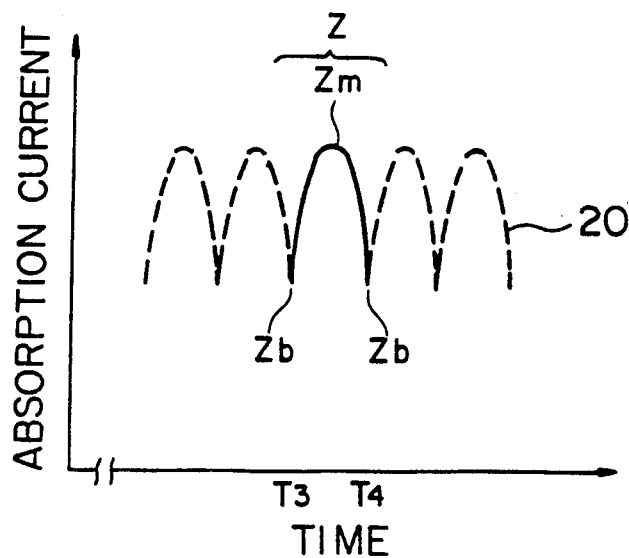
FIG. 18
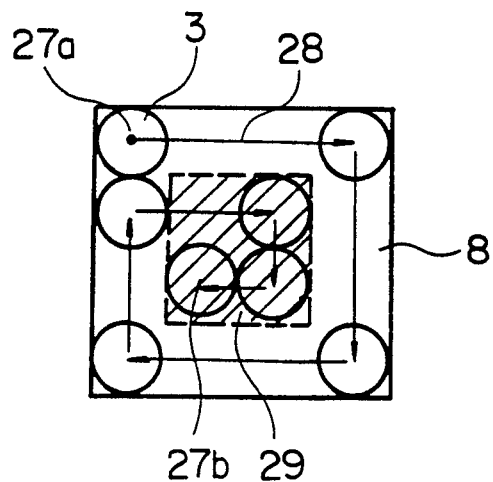
FIG. 19A
FIG. 19B
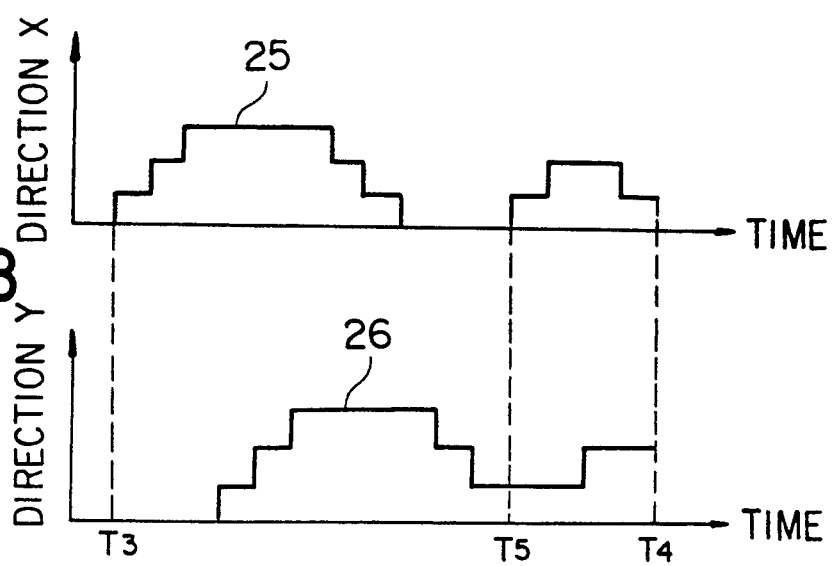

METHOD OF CONTROLLING ETCHING WITH A FOCUSED CHARGED BEAM BY DETECTING ELECTRICAL CURRENT OR SECONDARY ELECTRONS

BACKGROUND OF THE INVENTION

1. Field of the Invention

The present invention relates to a method of manufacturing semiconductor devices using charged beams, and, more particularly, to a method of etching a semiconductor device, the method being suitably used for manufacturing a reliable semiconductor device.

2. Description of the Related Art

In accordance with the recent tendency of higher integration of semiconductor devices, a variety of technological developments and improvements have been made in charged-beam technologies including etching and depositing materials with finely focused ion beams. When the above-described technology is applied to an experimental semiconductor device, excellent efficiency can be obtained. Forming a predetermined pattern or finding and/or repairing a defective portion in a circuit can be performed by forming an aperture at a predetermined position in a semiconductor device or by cutting or connecting a predetermined pattern.

Then conventional example in which focused ion beams are used in a process for manufacturing a semiconductor device and, in particular, a conventional example in which the focused ion beams are used in an etching process will be described.

FIG. 1 is a schematic view which illustrates substrate 1 being etched by focused ion beams 3. FIGS. 2A and 2B are a plan view and a side-elevational cross sectional view, respectively, which illustrate a predetermined portion of the substrate 1 being etched. Referring to these drawings, the substrate 1 is placed on a frame 2 for treatment with focused ion beams (to be called ion beams hereinafter) 3. The substrate 1 is formed by successively depositing a first insulating film 5 which is a silicon oxide film, a first circuit film 6 which is an aluminum film, and a second insulating film which is a silicon oxide film on a semiconductor substrate (to be called a substrate hereinafter) 4 made of single crystal silicon or the like. A portion 8 to be processed with a scanning ion beams 3 is formed on the second insulating film 7. In this case, the first insulating film 5, the first circuit film 6, and the second insulating film 7 have film thicknesses of about 8,000 Å, about 7,000 Å and about 14,000 Å, respectively.

In order to gain access to the first circuit film 6 after the first insulating film 5, the first circuit film 6, and the second insulating film 7 have been formed in predetermined patterns, respectively, a contact hole 10 is first formed in the second insulating film 7 as shown in FIGS. 3A and 3B. Then, a second circuit film 11 is formed on the second insulating film 7 and in the contact hole 10 in such a manner that the second circuit film 11 is joined to the first circuit film 6. The second circuit film 11 is a metal film formed by depositing, for example, aluminum by CVD or a method in which ion beams are used.

The contact hole 10 is formed by applying the ion beam 3 scanning the path from 9 to 8, sputtering and etching layer 7. However, the top surface of the first circuit film 6 is oxidized during the process. Therefore, an excessive amount of material is, as shown in FIG. 3B, usually removed in such a manner that the contact hole 10 extends into the first circuit film 6 a certain depth in order to establish a perfect connection with the second circuit film 11.

Then beam scanning 9 performed for the purpose of forming the contact hole 10 will be described with reference to FIGS. 4A and 4B. The beam scanning 9 is performed from a scanning start point 14a to a scanning end point 14b in the portion 8 to be processed in response to beam scanning signals 12 and 13 which are the signals for scanning in the X and Y directions, respectively. For example, a circular ion beam 3a having a beam diameter A is used for scanning beam 9a from the scanning start point 14a in the X direction, which is to the right when viewed in FIG. 4A. In this state, the beam scanning signal 12 in the X direction has a staircase shape. In response to this signal, the above-described circular ion beam 3a is moved in a stepped manner, but is not moved in the Y direction. Therefore, the beam scanning signal 13 during this period is constant. The distance of the beam spot movement for a step is called a beam step d. When the ion beam 3a has reached the right end of the portion 8 to be processed, when viewed in the drawing, a downward beam scanning step 9b of length d in the Y direction is performed. Then, the beam is scanned along 9c in the left direction opposite to the X direction. Thus, beam scanning in the X and Y directions is repeated successively until the scanning beam 9 reaches the scanning end point 14b. The beam scanning for one scanning action from the scanning start point 14a to the scanning end point 14b is called a frame. As a result of the repetition of a predetermined number of one-frame beam scannings, the portion 8 to be processed is removed to a predetermined depth.

When, for example, a 5 μm×5 μm contact hole 10 is desired to be formed, it is necessary for about 30 frames of beam scanning to be performed where the ion beam 3 has an acceleration energy of 40 KeV Ga+ (gallium), an electric current of 50 pA, a beam diameter A is 1 μm, a beam step d of 0.1 μm, and a beam application time for each of the points is 100 μs.

The accuracy in detecting the end point in the process of etching and removing the material to form the contact hole 10 considerably influences the reliability of the manufactured semiconductor device. The layer the size of the chip serving as the semiconductor device, the more non-uniform the film thicknesses in a chip or a wafer, in spite of process controls. As a result, the etching sometimes cannot, be conducted completely or an overhang can be left. For example, in the former case, some of the second insulating film 7 is left after etching as shown in FIGS. 5A and 5B, causing a defective contact hole 15 to be formed. The defective contact hole 15 cannot be connected with the second circuit film 6, that is, an open circuit is left. Therefore, a desired semiconductor cannot be manufactured. In another case, the contact hole 16 passes through the first circuit film 6 and, in an extreme case, reaches the first insulating film 5. Therefore, the second circuit film 11 only contacts the first circuit film 6 along its side walls. Thus, the contact area is greatly reduced, and the contact resistance is extremely enlarged. Therefore, desired characteristics cannot be obtained.

Therefore, it is a critical factor to detect the end point of the etching process in which the contact hole 10 is formed.

The above-described end point detection can be performed by a method in which secondary ions, generated at the time of the application of the ion beam 3, and detected. If the secondary ions have been detected and furthermore silicon ion (Si+) and oxygen ion (O+) are detected, it can be determined that the second insulating film 7 has not yet been penetrated. Therefore, the etching is continued until aluminum ion (Al+) is detected.

However, the above-described method cannot be employed because of the reliability and cost of the required apparatus and the following problems:

(a) the generation efficiency of the secondary ions is unsatisfactory, and the S/N ratio is also unsatisfactory; and (b) a selection and an analyzing system for the secondary ions must be additionally provided for the required apparatus, causing the structure of the apparatus to become too complicated and the cost to be excessive.

A second method is available in which secondary electrons or an absorption current is detected. According to this method, the S/N ratio can be a relatively large value and the apparatus can thereby be built at a low cost. It can be suitably used as a development apparatus or a mass producing apparatus.

FIG. 7 is a schematic structural view which illustrates an ion beam apparatus provided with means for detecting the secondary electrons or the absorption current. Referring to the drawing, a secondary-electron detector 17 is disposed above the substrate 1 while an absorption current detector 19 is disposed below the frame 2 of the substrate 1 an end of the absorption current detector 19 being connected to the frame 2 and another end being grounded. When the ion beam 3 irradiates to the substrate 1 secondary electrons 21 are emitted from the substrate 1 the emission of the secondary electrons 21 being considerably influenced by the type and the shape of the substrate 1. Therefore, the end point in the etching process can be detected by detecting a change in the emission of the secondary electrons 21. In this case, the secondary electrons 21 generated when the ion beam 3 is applied are detected as a secondary electron signal 18 by the secondary-electron detector 17 comprising a scintillator.

There is an electronic current which passes to the ground via the frame 2 when the ion beam 3 is applied. This current is so called an absorption current IA. The relationship established at this time and an equivalent circuit are schematically shown in FIGS. 8A and 8B, respectively. Since the absorption current IA is the sum of an ion beam current IB and a current ISE generated due to the emission of the secondary electrons, the end point in the etching process can be detected by detecting the above-described absorption current IA. When the absorption current IA is used, the absorption current detector 19 detects the absorption current IA which is generated when the ion beam 3 is applied as an absorption current signal 20.

An example in which the above-described absorption current signal 20 is used for detecting the end point in the etching process for forming the contact hole 10 will be described. FIG. 9 is a graph which illustrates the relationship between processing time and the absorption current. The absorption current detection signal 20 becomes as shown in FIG. 9 in accordance with the scanning 9 with the ion beam 3. FIG. 10 illustrates an upper envelope curve 22 and a lower envelope curve 23, each of which connects the maximum values and minimum values of the absorption current signal 20 shown in FIG. 9. The time (initial exposure time) taken for the first circuit film 6 disposed beneath the second insulating film 7, to appear was T1, while the time (complete exposure time) taken for the first circuit film 6 to appear in the entire surface of the contact hole 10 was T2. Considering the upper envelope curve 22, it is apparent that both the initial exposure time T1 and the complete exposure time T2 are positioned beyond the inflection point of the upper envelope curve 22 from the descent curve to the ascent curve. However, it is difficult to correctly determine the positions of the above-described times in the upper envelope curve 22.

In consideration of the lower envelope curve 23, it is apparent that the initial exposure time T1 is positioned in the vicinity of the inflection point of the lower envelope curve 23 from the descent curve to the ascent curve. However, it is difficult to determine the correct position of the complete exposure time T2 on the lower envelope curve 23. As described above, it has been extremely difficult to determine the end point in the etching process even if the upper and the lower envelope curves 22 and 23 formed by taking out the predetermined portion of the absorption current signal 20 are used.

When the secondary electron signal 18 was used, a similar result was displayed in which the absorption current signal 20 is used.

The results of a study of the reason for this will be described. A state of forming the contact hole 10 and the absorption current signal 20 during the process of forming the contact hole 10 are considered and analyzed in detail. The results will now be described. The process for preparing the substrate 1 as shown in FIGS. 11A and 11B is sectioned into first and second stages to study each of the two stages.

In the first stage, the second insulating film 7 is etched. Plan and cross sectional views are shown in FIGS. 12A and 12B, respectively. The absorption current signal 20 at this time is shown in FIG. 13. The ion beam 3 was used to successively perform a one-frame scanning from the scanning start point 14a to the scanning end point 14b to repeat this one-frame scanning a predetermined number of times until the second insulating film 7 has been etched to a predetermined depth. Each of the waveforms X of the absorption current signal 20 corresponds to a one-frame scanning with the ion beam 3. The waveform is substantially in the form of a U-shape and has its maximum values Xm at the two ends thereof and its minimum value Xb at the middle point between the two ends thereof. Assuming that the time at which the ion beam 3 is at the scanning start point 14a is T3 and the time at which it is at the scanning end point 14b is T4, the waveform has the maximum value Xm at the time T3 and time T4, while it has the minimum value Xb at the middle point between T3 and T4. The reason for this lies, as schematically shown in FIG. 14, in that a large quantity of secondary electrons 21 are emitted when the ion beam 3 is applied in the vicinity of the boundary of the portion 8 but the emission of the secondary electrons 21 is limited in the central portion.

In the second state, a portion of the first circuit film 6 has appeared due to the further progression of the etching. Plan and cross sectional views are shown in FIGS. 15A and 15B, respectively. The absorption current signal 20 corresponding to this time is shown in FIG. 16.

As is shown from these drawings, a portion of the main surface of the first circuit film 6 has appeared since the second insulating film 7 of a central portion 8a in the portion 8 has been removed. The waveform Y of the absorption current signal 20 is substantially in the form of a Y-shape and has maximum values Ym at times T3 and T4 at the scanning start point 14a and the scanning end point 14b, while a projecting extreme value Yn is displayed between T3 and T4. The reason for this lies in that the etching speed is raised in the above-described central portion due to the overlapping effect of the intensities of the ion beams 3, causing the first circuit film 6 to appear and increasing the emission of the secondary electrons.

In a third state where the second insulating film 7 has been removed from the entire surface of the portion 8 due to the further progression of the etching, the first circuit film 6 appears. Plan and cross sectional views of this state are shown in FIGS. 11A and 11B, respectively. The absorption current signal 20 corresponding to this time is shown in FIG. 17. The waveform Z of the absorption current signal 20 is substantially in the form of an inverted U-shape. The waveform Z has its minimum values Zb at both time T3 and time T4 at the scanning start point 14a and the scanning end point 14 and has its maximum value Am at the middle point of T3 and T4. The reason for this lies in that the second insulating film 7 emits a relatively small quantity of secondary electrons 21 with respect to the first circuit film 6 and is positioned in the vicinity of the above-described portion 8. The first circuit film 6, which emits a large quantity of the secondary electrons 21, is present in the central portion.

As is shown from the results of the above-described analysis, the absorption current signal 20 varies depending upon the type and the structure of the material in the portion 8 to be processed and upon the method of beam scanning 9. As a result, the monitoring of the etching can be performed, regardless of the structure of the material to be processed and the method of the beam scanning 9, by measuring the absorption current signal 20 at the time of the scanning with the ion beam 3 on the central portion 8a of the portion 8.

A method, has been disclosed in Japanese Published Patent Application No. 62-210625 in which the processing is monitored by beam scanning only the central portion of the portion to be processed. However, according to this method, since an excessive ion beam portion is applied only in the central portion, a problem arises in that the overall region is processed non-uniformly.

According to the above-described methods, semiconductor devices are manufactured in such a manner that the ion beam 3 is applied to the substrate 1 and the absorption current or the secondary electrons are detected so that the secondary electron signal 18 or the absorption current signal 20 is used to detect the end point of the etching 8 in the substrate 1 to be processed. However, the end point cannot be determined accurately and, therefore, good control could not be achieved. Furthermore, if the end point is detected by excessively scanning only the central portion of the portion 8, the thus processed portion becomes non-uniform and semiconductor devices thus manufactured lose their reliability.

SUMMARY OF THE INVENTION

Therefore, an object of the present invention is to provide a method of manufacturing a semiconductor device overcoming the above-described problems and in which the end point of etching can be precisely detected and controlled at the time of etching using charged beams.

According to the present invention, there is provided a method of manufacturing a semiconductor device comprising spirally applying focused charged beams to a predetermined portion of a semiconductor substrate to be processed; detecting an electric current passing from the semiconductor substrate to ground or secondary electrons generated from the semiconductor substrate, the electric current or the secondary electrons being generated when the charged beams are applied to a central portion spaced from the area to be processed by, at least, a distance corresponding to the diameter of the charged beam; and controlling removal of the area to be processed in accordance with a change in the detection signal obtained from the detection of the electric current or the secondary electrons.

Other and further objects, features, and advantages of the invention will be appear more fully from the following description.

BRIEF DESCRIPTION OF THE DRAWINGS

FIGS. 4A and 4B, 11A, 11B, 12A, 12B, 15A and 15B are respectively plan views and side-elevational cross sectional views which illustrate a conventional method of scanning using focused ion beams;

FIG. 13 illustrates the waveform of the absorption current signal corresponding to FIGS. 12A and 12B;

FIG. 14 is a schematic view which illustrates secondary electron generation;

FIG. 17 illustrates the waveform of the absorption current signal corresponding to FIGS. 11A and 11B;

FIG. 18 is a schematic view which illustrates a method of beam scanning according to an embodiment of the present invention;

FIGS. 19A and 19B illustrate a beam scanning signal for performing the beam scanning shown in FIG. 18;

DESCRIPTION OF THE PREFERRED EMBODIMENTS

A preferred embodiment of the present invention will be described with reference to the drawings. The structure of an ion beam apparatus for etching the substrate 1 is the same as that shown in FIG. 11. However, the method of scanning with the ion beam 3 and the detection signal used for the end point of the etching is different.

Figure 1:
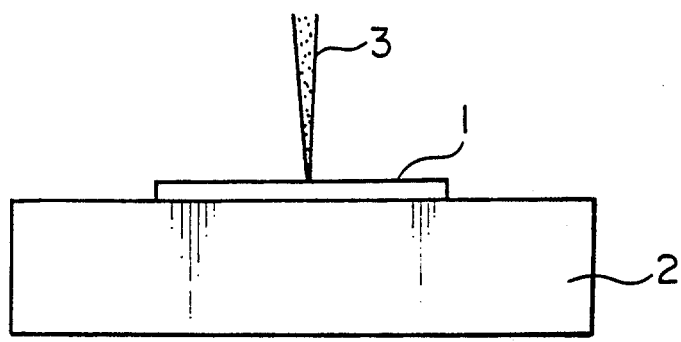
FIG. 1 is a schematic view which illustrates a substrate being etched by focused beams.
Figure 2A:
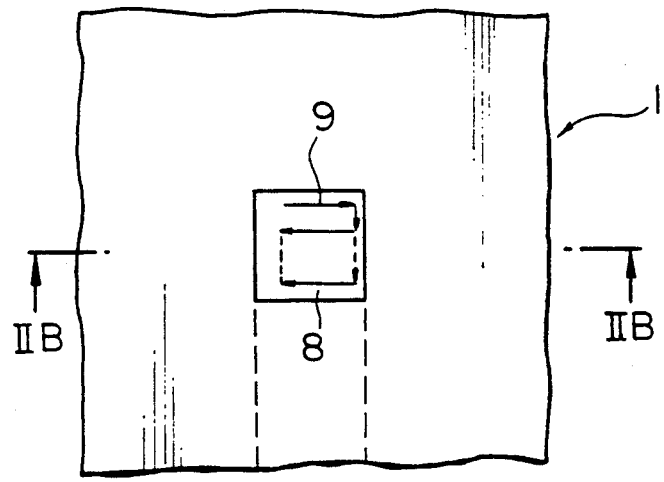
FIGS. 2A and 2B are respectively a plan view and a side-elevational cross sectional view which illustrate a predetermined portion of a substrate being etched.
Figure 2B:
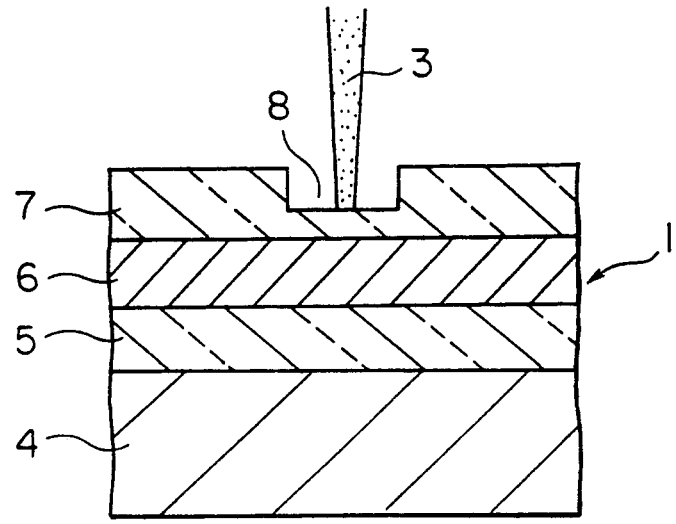
Figure 3A:
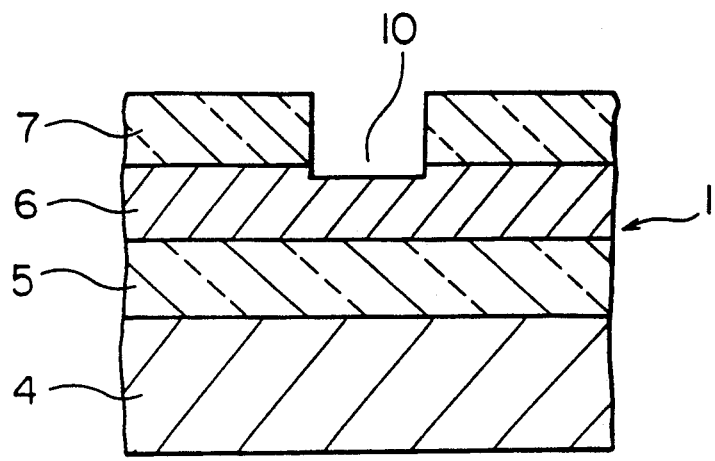
FIGS. 3A and 3B, 5A, 5B, 6A and 6B are side-elevational cross sectional views which illustrate a substrate being processed.
Figure 3B:
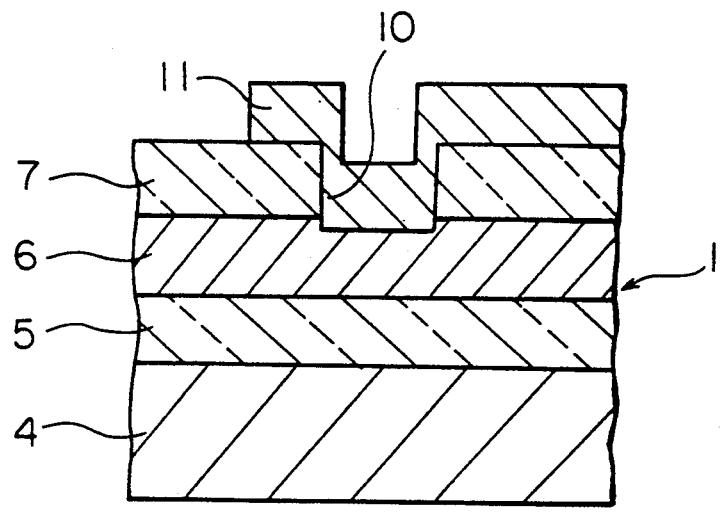
Figure 4A:
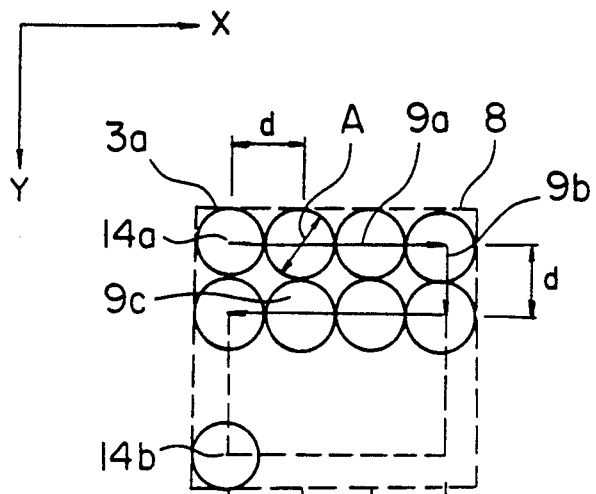
Figure 4B:
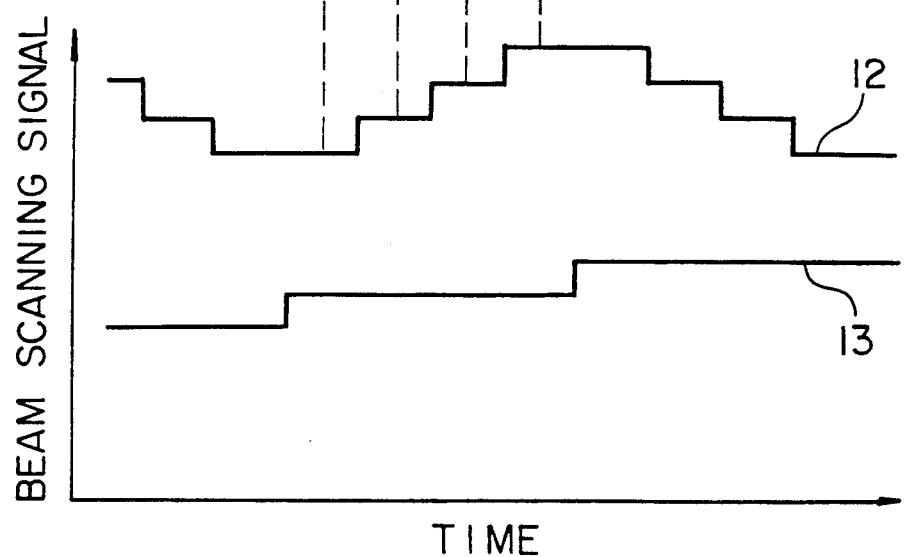
Figure 5A:
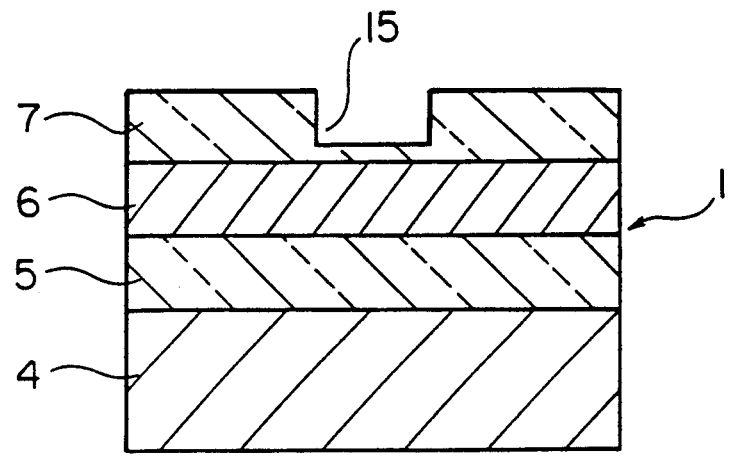
Figure 5B:
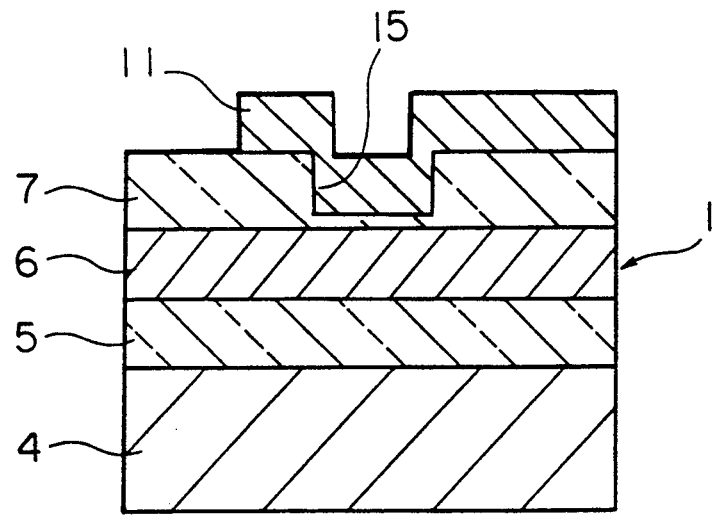
Figure 6A:
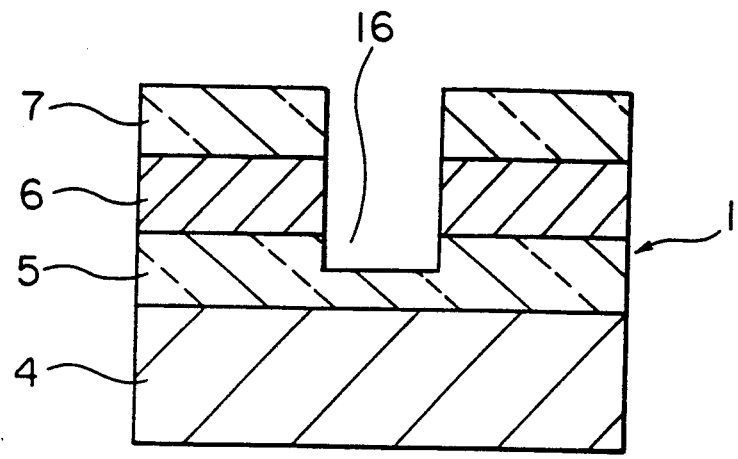
Figure 6B:
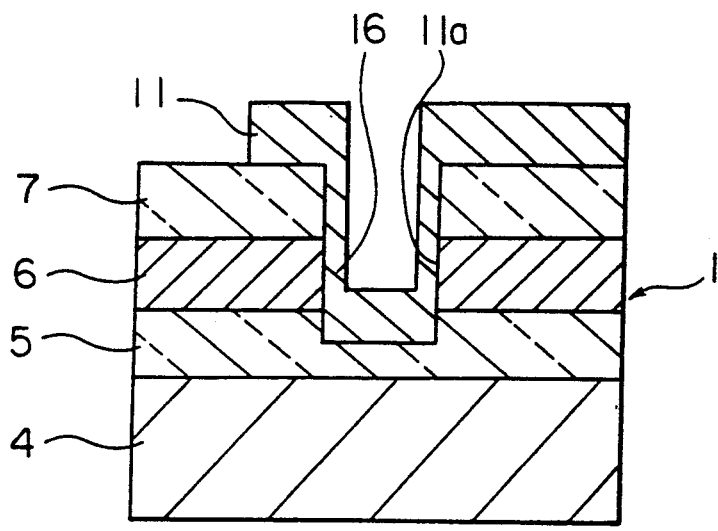
Figure 7:
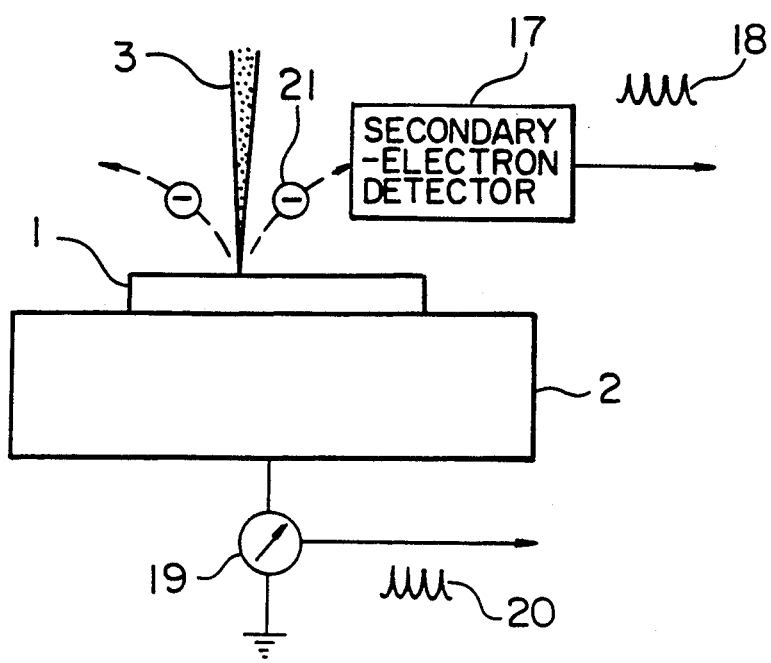
FIG. 7 is a schematic of an ion beam apparatus with means for detecting secondary electrons and an absorption electric current.
Figure 8A:
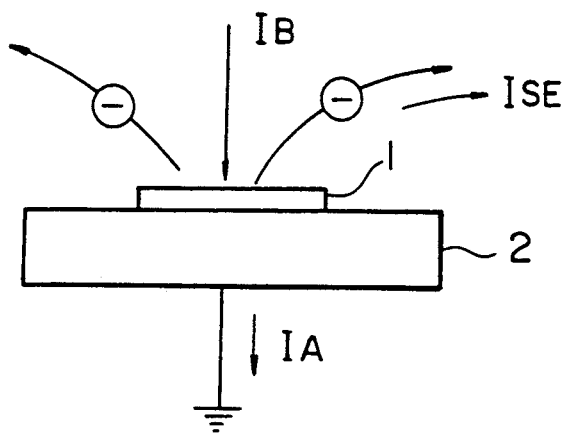
FIGS. 8A and 8B are schematic views which illustrate the absorption current.
Figure 8B:
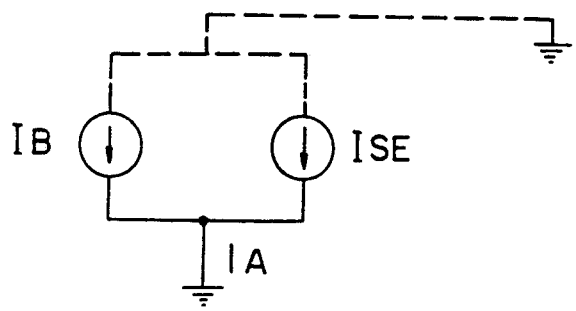
Figure 9:
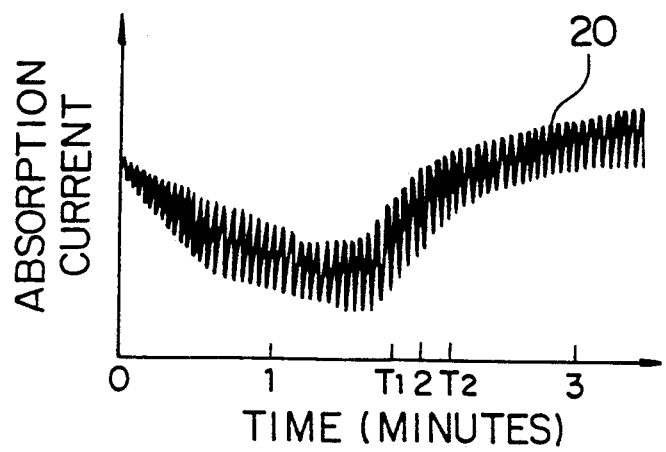
FIG. 9 illustrates the absorption current signal produced by conventional focused ion beams.
Figure 10:
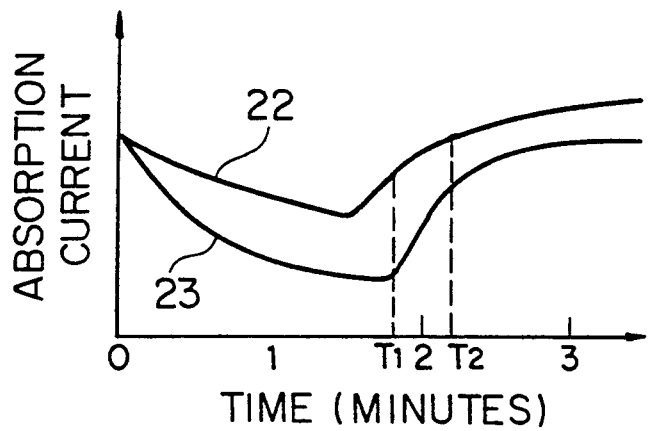
FIG. 10 illustrates the envelopes of the signals shown in FIG. 9.
Figure 15A:
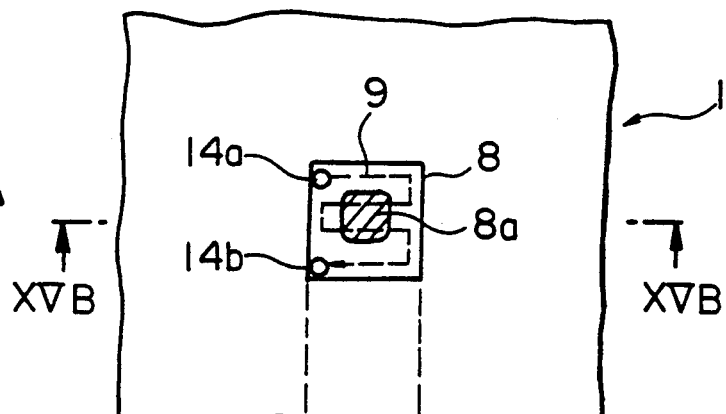
Figure 15B:
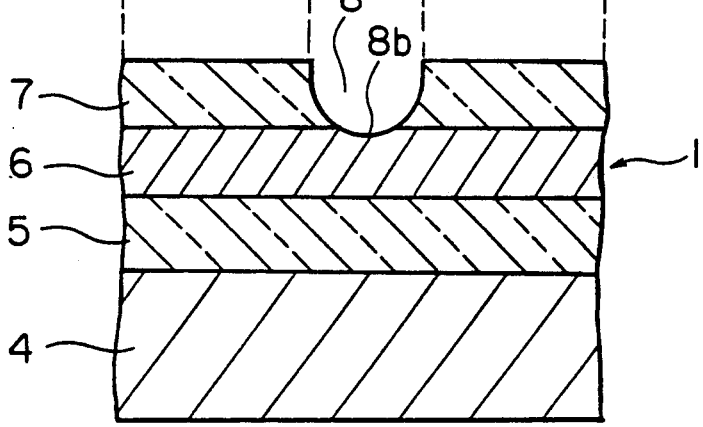
Figure 16:
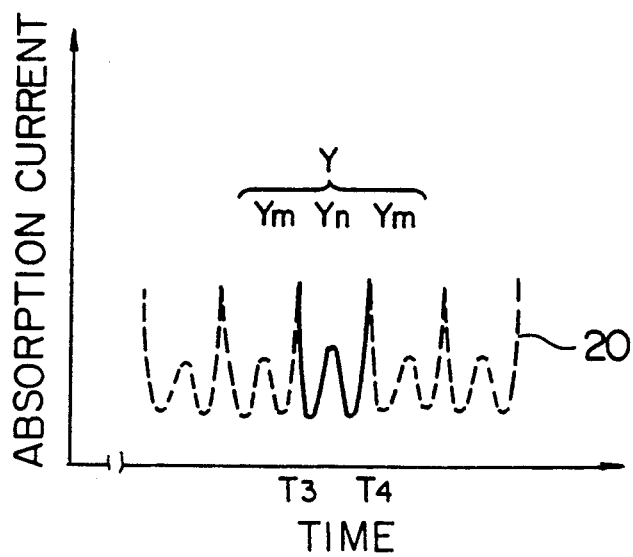
FIG. 16 illustrates the waveform of the absorption current signal corresponding to FIGS. 15A and 15B.
Figure 20:
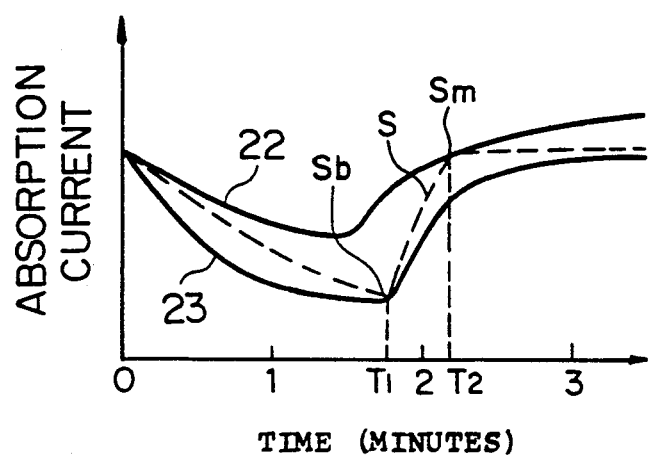
FIG. 20 illustrates a detection signal according to the embodiment of the present invention.

FIG. 18 is a schematic view which illustrates a method of scanning using beams according to an embodiment of the present invention. FIGS. 19A and 19B illustrate a beam scanning signal causing the beam to scan as shown in FIG. 18. FIG. 20 illustrates a detection signal according to an embodiment of the present invention.

When beam scanning signals 25 and 26 in the X and Y directions for a frame are supplied as shown in FIGS. 19A an 19B at the time of etching the substrate 1 of a semiconductor device, the ion beam 3 spirally scans from a scanning start point 27a to a scanning end point 27b which is positioned in the vicinity of a central area 29 of the portion 8 to be processed as designated by lines of FIG. 18. Referring to FIGS. 19A and 19B, symbol T3 represents the starting time for the scanning for a frame, T4 represents the end time for the scanning for a frame and T5 represents the starting time for measuring the absorption current.

When the absorption current IA is measured only a period from the starting time T5 for measuring the absorption current to the end time T4 for the scanning for a frame and the absorption current IA is not measured at any other time, the absorption current signal 20 corresponding to the central portion 29 shown in FIG. 18 can be obtained. In this case, there are two opportunities to detect the absorption current signal 20, that is, the time T4 and T5, for one frame. Therefore, even if the beam scanning 28 is performed at high speed, the above-described absorption current detector 19 need not have high speed response characteristics. As a result, the absorption current detector 19 can be readily built.

When the central area 8a of the portion 8 is scanned with the ion beam 3, the waveform of the absorption current signal 20 displays waveform S as shown in FIG. 20. The waveform S has a lower inflection point Sb at which the curve inflects from descent to ascent and an upper inflection point Sm at which the curve inflects from ascent to constant. The lower inflection point Sb corresponds to the initial exposure time T1, while the upper inflection point Sm corresponds to the complete exposure time T2. The state of the etching operation can be accurately monitored by detecting the inflection points Sb and Sm of the scanning waveform S at the central portion 8a. Therefore, the etching end point can be correctly detected by using the above-described method.

Figure 21:
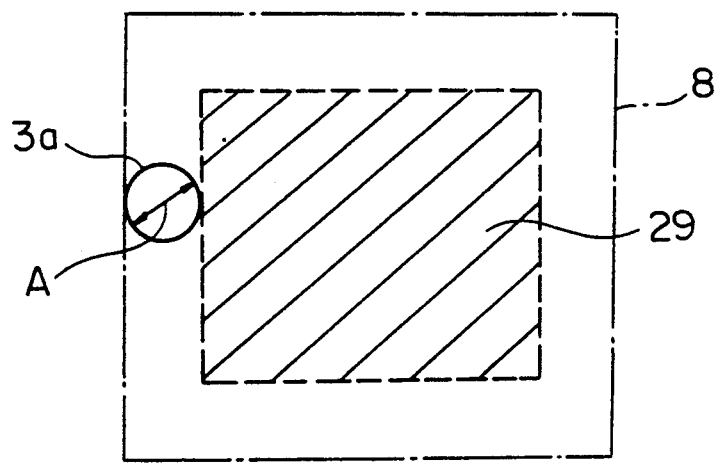
FIG. 21 is a plan view which illustrates the central portion at the time of the processing of the semiconductor substrate.

As shown in FIG. 21, the central portion 29 at which the absorption current IA is measured may be arranged within the inside portion (slanting line section) and spaced from the outer circumference of the area 8 to be processed by the distance corresponding at least to the diameter of the ion beam 3.

As described above, the absorption current IA is measured only during the spiral scanning with the ion beam 3 over the central portion 29 of the area 8 to produce the absorption current signal 20, which is the detection signal for this portion, for controlling the etching state Therefore, the etching end point can be correctly detected and uniform processing can be obtained. As a result, a reliable semiconductor device can be obtained.

Although the absorption current is used to detect the etching end point in the above-described embodiment, another structure may also be employed for controlling the etching state, the structure being arranged in such a manner that the secondary electrons 21 are detected and the secondary electron signal 18 used.

Although the substrate 1 to be processed is structured in such a manner that the second insulating film 7 is formed on the first circuit film 6 and the area 8 is the portion at which the contact hole 10 is formed in the second insulating film 7, another structure may be employed in which a structure other than the contact hole 10 is formed.

Furthermore, although the etching is performed using the ion beam 3 according to the present invention, etching, performed in such a manner that a reactive gas is supplied and focused electron beams are used to scan the substrate 1 may be employed. According to this method, a similar effect can be obtained.

Although the invention has been described in its preferred form with a certain degree of particularity, it is understood that the present disclosure of the preferred form may be changed in the details of construction and the combination and arrangement of parts without departing from the spirit and the scope of the invention as hereinafter claimed.

What is claimed is:

1. A method of manufacturing a semiconductor device comprising:

applying a focused charged beam having a diameter and a beam area in a generally spiral pattern to a predetermined area of a semiconductor substrate, the predetermined area being larger than the beam area, to remove material from the predetermined area of the substrate and expose an underlying layer;

detecting an electrical current passing from the semiconductor substrate to ground only when the charged beam is applied to a central portion of the predetermined area of the semiconductor substrate, the central area being spaced from the perimeter of the predetermined area of the semiconductor substrate by a distance of at least the diameter of the charged beam; and controlling removal of material from the predetermined area of the semiconductor substrate in accordance with changes in a detection signal derived from the electrical current detected only when the charged beam is applied to the central portion of the predetermined area.

2. A method according to claim 1 wherein the charged beam is an ion beam.

3. A method according to claim 1 wherein the charged beam is an electron beam.

4. A method according to claim 1 including repetitively applying the focused charged beam to the predetermined area of the semiconductor substrate while measuring the electrical current only when the charged beam is applied to the central portion of the predetermined area of the semiconductor substrate until the underlying layer is exposed.

5. A method according to claim 1 wherein the electrical current generated only when the charged beam is applied to the central portion of the predetermined area of the semiconductor substrate and the detection signal change discontinuously when the underlying layer is exposed including terminating removal of material from the semiconductor substrate when the detection signal changes discontinuously.

6. A method of manufacturing a semiconductor device comprising:

applying a focused charged beam having a diameter and a beam area in a generally spiral pattern to a predetermined area of a semiconductor substrate, the predetermined area being larger than the beam area, to remove material from the predetermined area of the substrate and expose an underlying layer;

detecting secondary electrons generated from said semiconductor substrate only when the charged beam is applied to a central portion of the predetermined area of the semiconductor substrate, the central area being spaced from the perimeter of the predetermined area of the semiconductor substrate by a distance of at least the diameter of the charged beam; and controlling removal of material from the predetermined area of the semiconductor substrate in accordance with changes in a detection signal derived from the secondary electrons detected only when the charged beam is applied to the central portion of the predetermined area.

7. A method according to claim 6 wherein the charged beam is an ion beam.

8. A method according to claim 6 wherein the charged beam is an electron beam.

9. A method according to claim 6 including repetitively applying the focused charged beam to the predetermined area of the semiconductor substrate while detecting the secondary electrons only when the charged beam is applied to the central portion of the predetermined area of the semiconductor substrate until the underlying layer is exposed.

10. A method according to claim 6 wherein the quantity of secondary ions generated only when the charged beam is applied to the central portion of the predetermined area of the semiconductor substrate and the detection signal change discontinuously when the underlying layer is exposed including terminating removal of material from the semiconductor substrate when the detection signal changes discontinuously.

* * * * *